United States Patent
Reshetouski et al.

(10) Patent No.: US 11,546,530 B2
(45) Date of Patent: Jan. 3, 2023

(54) IMAGING DEVICE AND SOLID-STATE IMAGING DEVICE

(71) Applicant: SONY CORPORATION, Tokyo (JP)

(72) Inventors: Ilya Reshetouski, Tokyo (JP); Atsushi Ito, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/284,600

(22) PCT Filed: Aug. 26, 2019

(86) PCT No.: PCT/JP2019/033232
§ 371 (c)(1),
(2) Date: Apr. 12, 2021

(87) PCT Pub. No.: WO2020/079960
PCT Pub. Date: Apr. 23, 2020

(65) Prior Publication Data
US 2021/0258517 A1  Aug. 19, 2021

(30) Foreign Application Priority Data

Oct. 19, 2018  (JP) ............................. JP2018-197319

(51) Int. Cl.
*H04N 5/33* (2006.01)
*G01J 5/08* (2022.01)
(Continued)

(52) U.S. Cl.
CPC .............. *H04N 5/33* (2013.01); *G01J 1/0474* (2013.01); *G01J 5/0802* (2022.01); *H01L 27/14625* (2013.01); *G01J 2005/0077* (2013.01)

(58) Field of Classification Search
CPC .... G01J 1/02; G01J 1/04; G01J 1/0407; G01J 1/0474; G01J 2005/0077; G01J 5/0802;
(Continued)

(56) References Cited

U.S. PATENT DOCUMENTS 9,405,124 B2 *  8/2016  Hirsch .................. G02B 30/27
9,645,008 B2     5/2017  Jia et al.
(Continued)

FOREIGN PATENT DOCUMENTS

CA          2647041 A1     10/2007
CN        105593651 A      5/2016
(Continued)

OTHER PUBLICATIONS

International Search Report and Written Opinion of PCT Application No. PCT/JP2019/033232, dated Nov. 5, 2019, 8 pages of ISRWO.
(Continued)

*Primary Examiner* — John R Lee
(74) *Attorney, Agent, or Firm* — Chip Law Group

(57) ABSTRACT

An artifact caused by secondary reflection is reduced. An imaging device according to an embodiment includes: a diffuser (110) that converts incident light into scattered light whose diameter is expanded in accordance with a propagation distance and outputs the scattered light; and a light receiver (132) that converts light diffused by the diffuser into an electric signal.

15 Claims, 12 Drawing Sheets

(51) Int. Cl.
  *G01J 5/0802* (2022.01)
  *G01J 1/04* (2006.01)
  *H01L 27/146* (2006.01)
  *G01J 5/00* (2022.01)

(58) Field of Classification Search
  CPC ........... H01L 31/02327; H01L 31/0232; H01L 27/146; H01L 27/14601; H01L 27/14625; H04N 5/33; H04N 5/369
  See application file for complete search history.

(56) References Cited

U.S. PATENT DOCUMENTS

| | | |
|---|---|---|
| 9,891,098 B2 | 2/2018 | Shedletsky |
| 10,783,652 B2 * | 9/2020 | Pau .................. G03B 41/00 |
| 2006/0214673 A1 | 9/2006 | Tamai |
| 2006/0244851 A1 | 11/2006 | Cartlidge |
| 2007/0015068 A1 * | 1/2007 | Nagahama ........... G02B 3/0012 430/5 |
| 2007/0221826 A1 | 9/2007 | Bechtel et al. |
| 2009/0040629 A1 | 2/2009 | Bechtel et al. |
| 2013/0334423 A1 | 12/2013 | Henderson |
| 2015/0233762 A1 | 8/2015 | Goldring et al. |
| 2015/0292948 A1 | 10/2015 | Goldring et al. |
| 2015/0300879 A1 | 10/2015 | Goldring et al. |
| 2015/0355024 A1 | 12/2015 | Goldring et al. |
| 2016/0238449 A1 | 8/2016 | Goldring et al. |
| 2017/0234729 A1 | 8/2017 | Goldring et al. |
| 2018/0180481 A1 | 6/2018 | Goldring et al. |
| 2018/0182069 A1 * | 6/2018 | Xiong .................. G06T 3/4061 |
| 2018/0337291 A1 | 11/2018 | Enichlmair |
| 2019/0033132 A1 | 1/2019 | Goldring et al. |
| 2020/0393297 A1 | 12/2020 | Goldring et al. |
| 2021/0258517 A1 * | 8/2021 | Reshetouski ......... G01J 1/0474 |
| 2021/0302232 A1 | 9/2021 | Goldring et al. |

FOREIGN PATENT DOCUMENTS

| | | |
|---|---|---|
| EP | 2005233 A2 | 12/2008 |
| EP | 3028020 A2 | 6/2016 |
| GB | 2543655 A | 4/2017 |
| JP | 2004-266250 A | 9/2004 |
| JP | 2005-331371 A | 12/2005 |
| JP | 5698454 B2 | 4/2015 |
| JP | 2016-528496 A | 9/2016 |
| KR | 10-2008-0108294 A | 12/2008 |
| WO | 2007/111984 A2 | 10/2007 |
| WO | 2015/015493 A2 | 2/2015 |
| WO | 2016/091757 A1 | 6/2016 |

OTHER PUBLICATIONS

Partial Supplementary European Search Report of EP Application No. 19873204.2, dated Dec. 14, 2021, 14 pages.

* cited by examiner

[ FIG. 1 ]
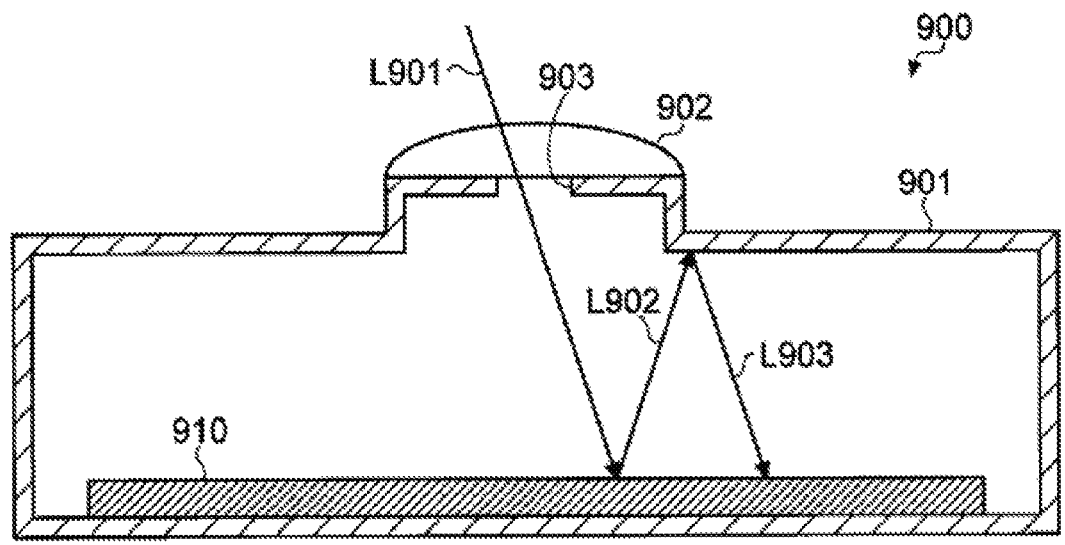
[ FIG. 2 ]
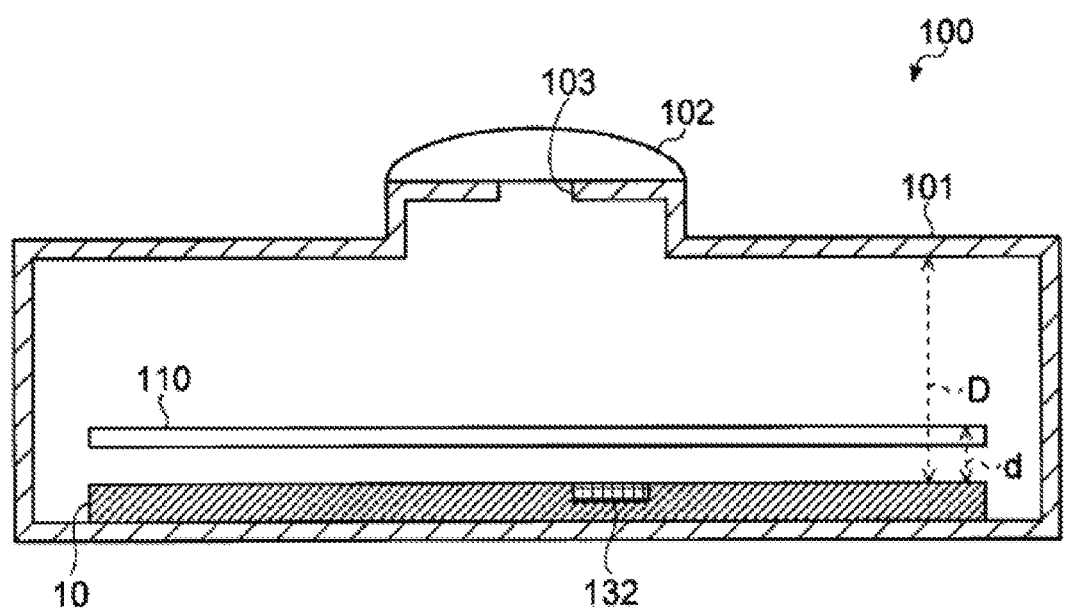

[ FIG. 3 ]
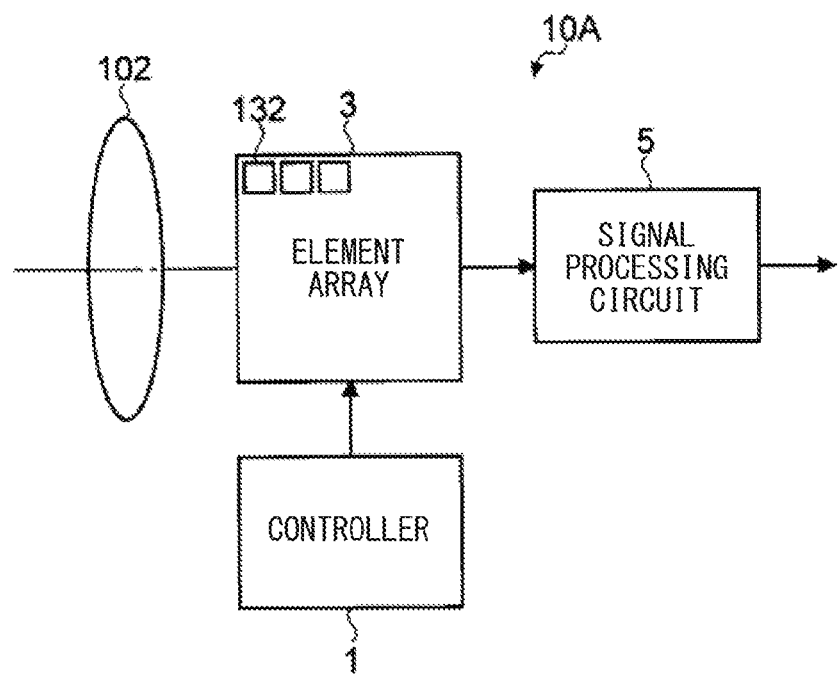

[ FIG. 4 ]
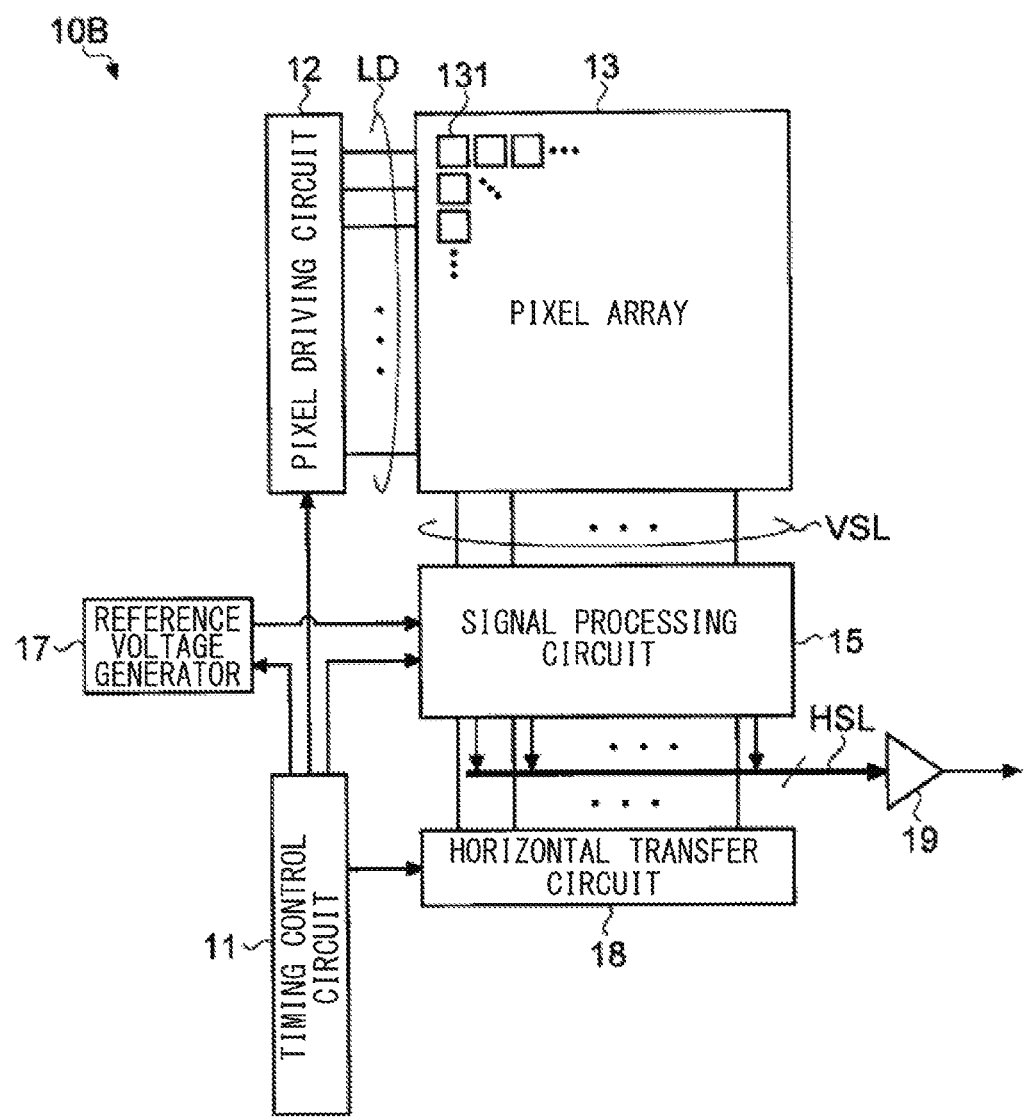

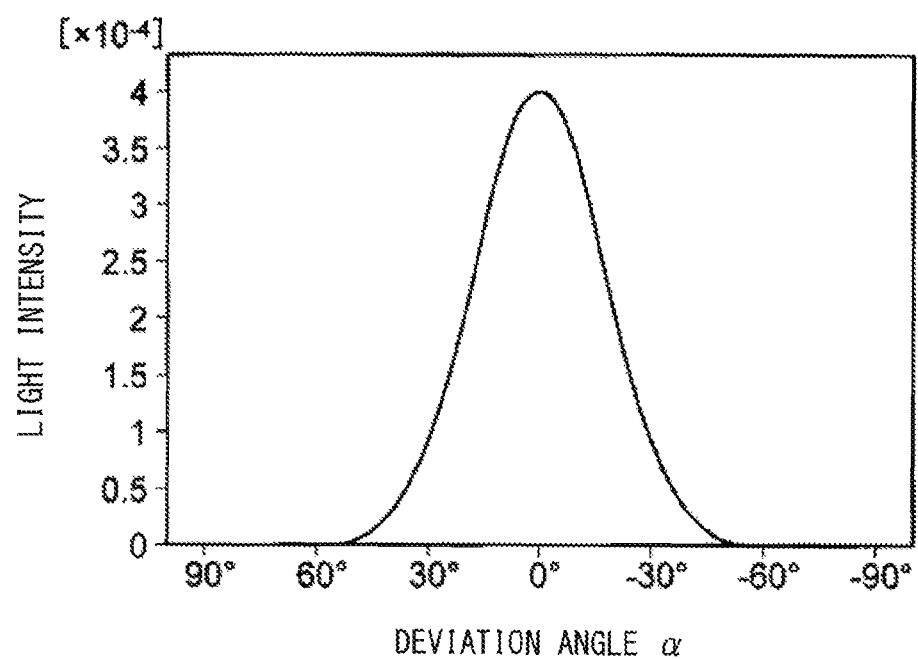
[ FIG. 5 ]

[ FIG. 6 ]
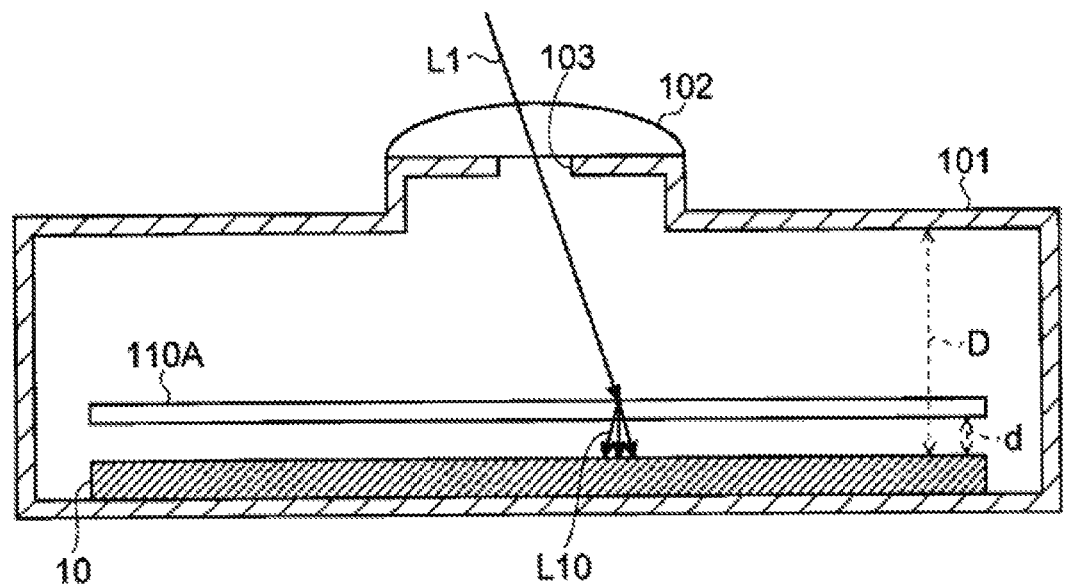
[ FIG. 7 ]
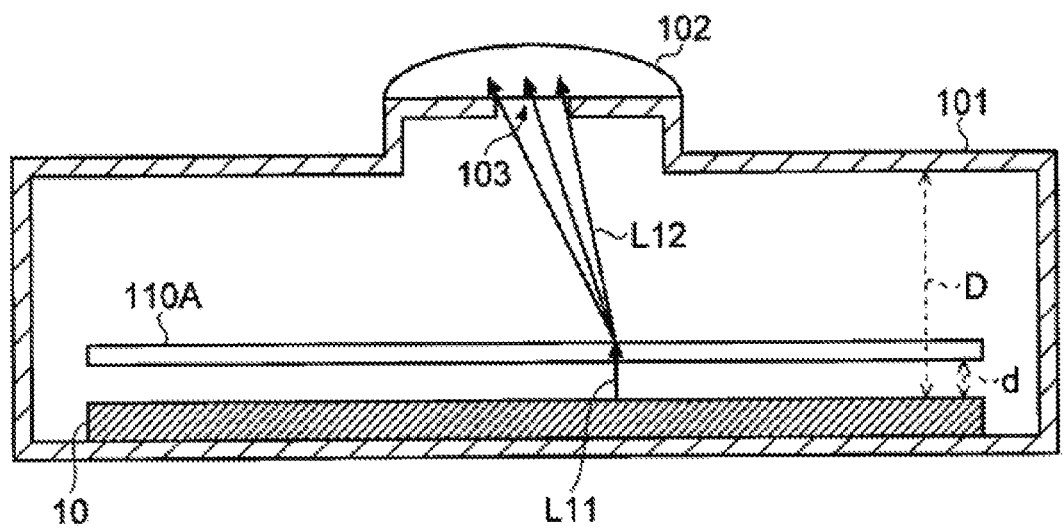

[ FIG. 8 ]
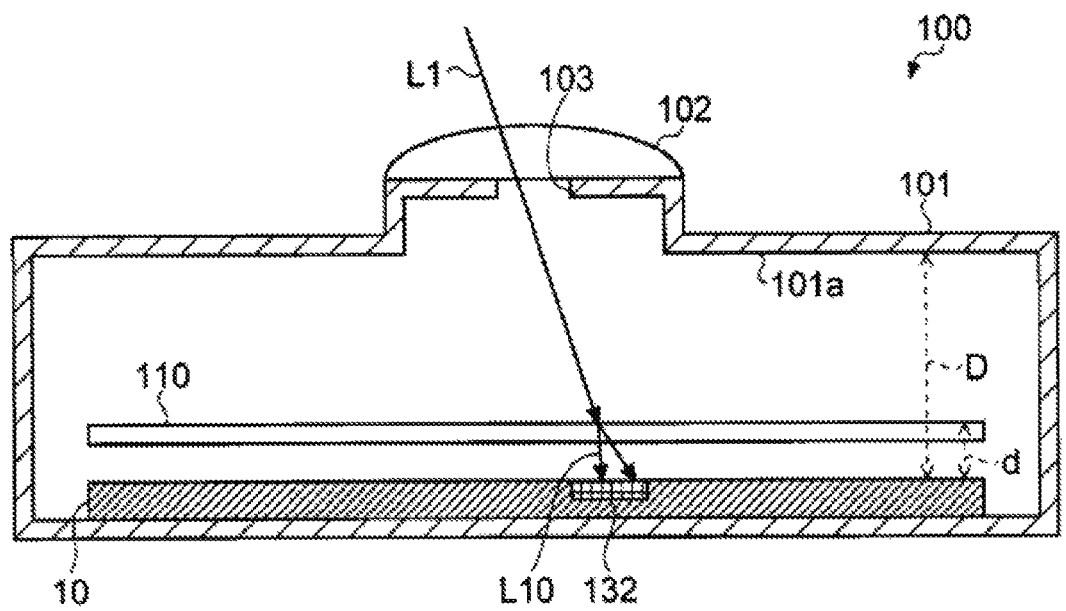
[ FIG. 9 ]
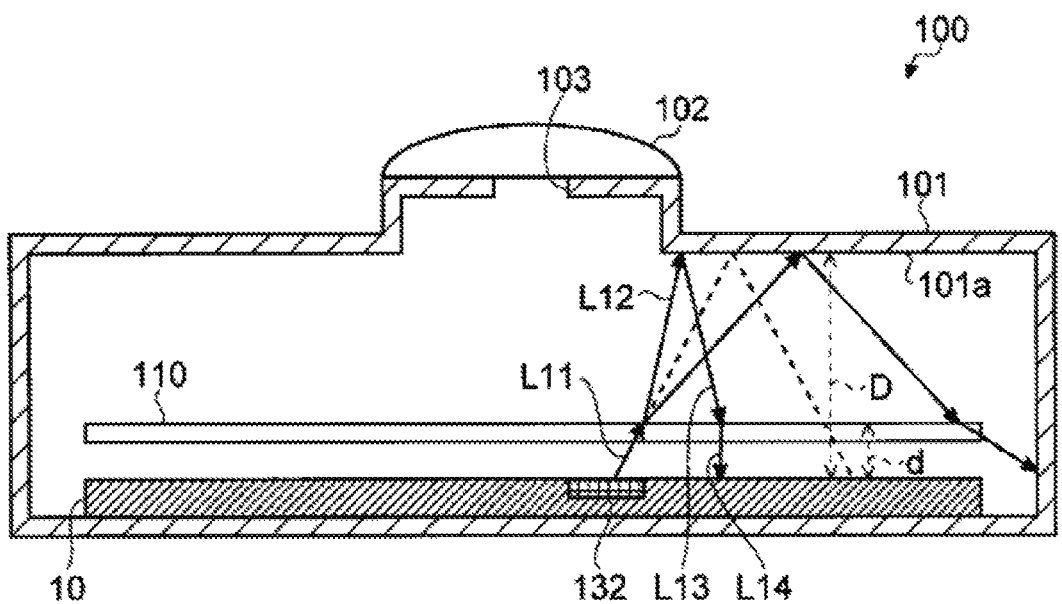

[FIG. 10]
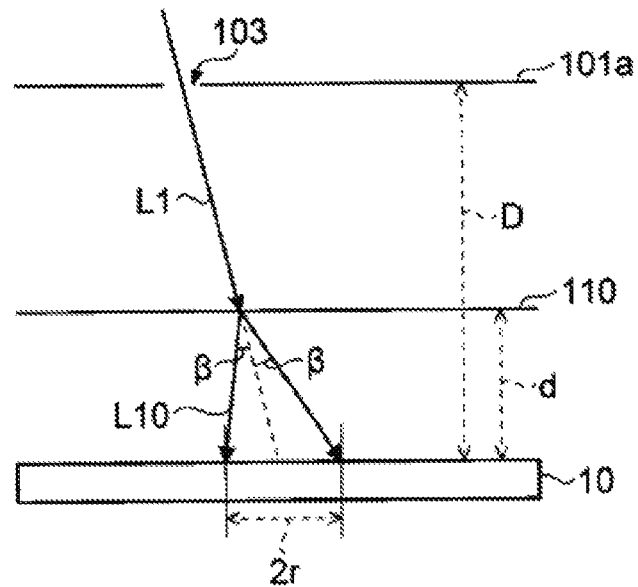
[FIG. 11]
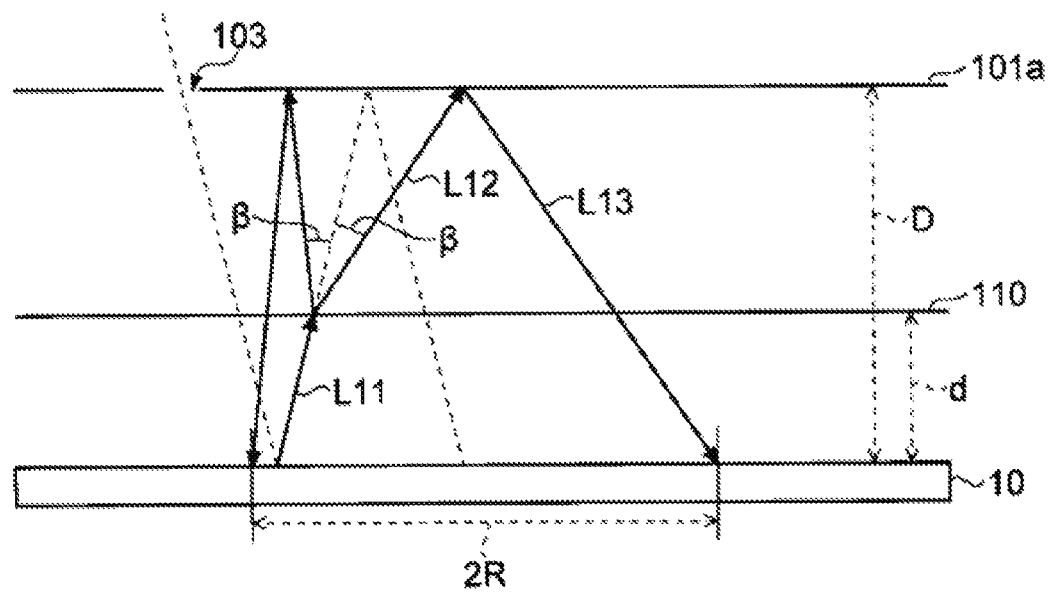

[ FIG. 12 ]
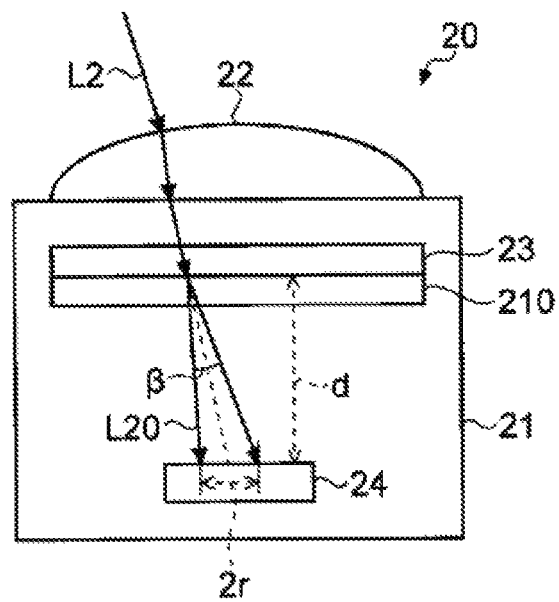
[ FIG. 13 ]
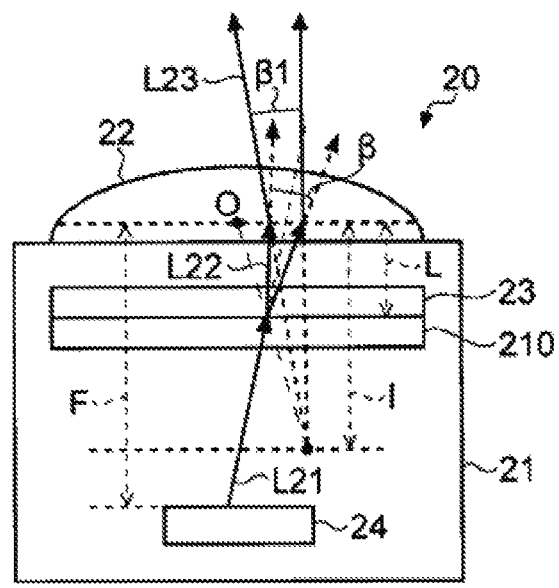

[ FIG. 14 ]
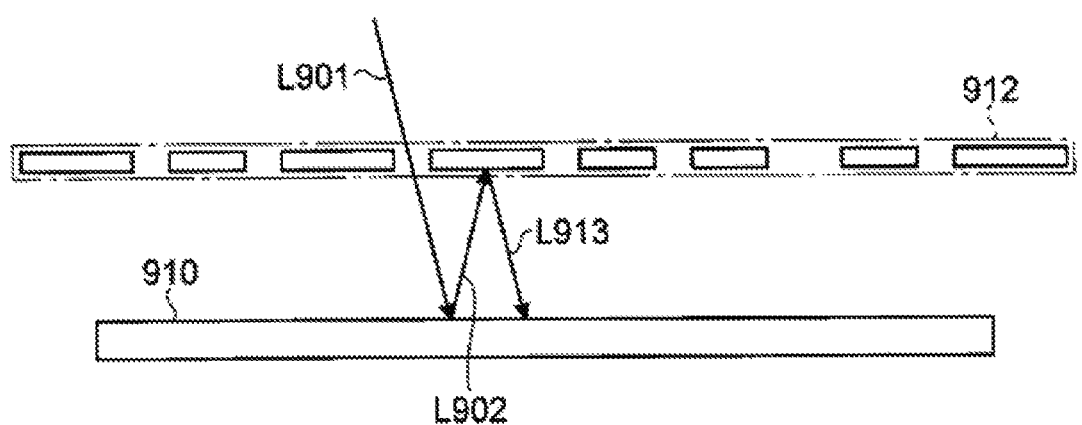
[ FIG. 15 ]
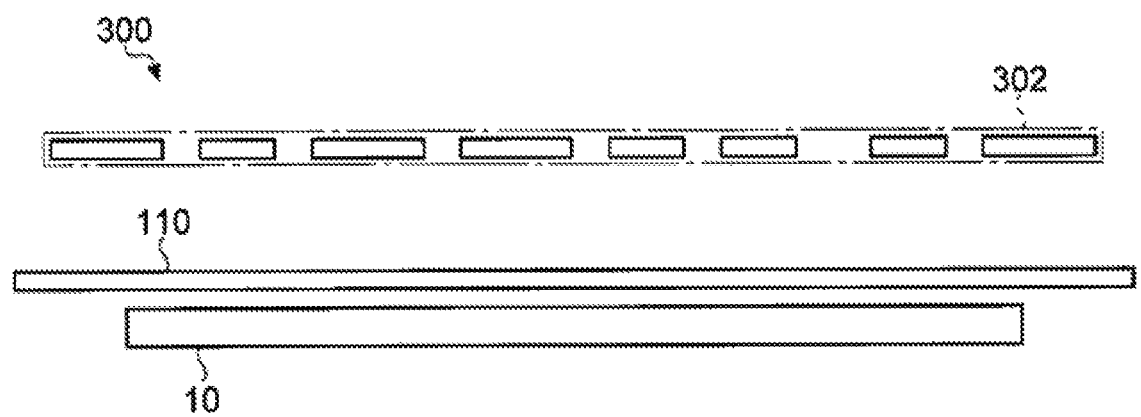

[ FIG. 16 ]
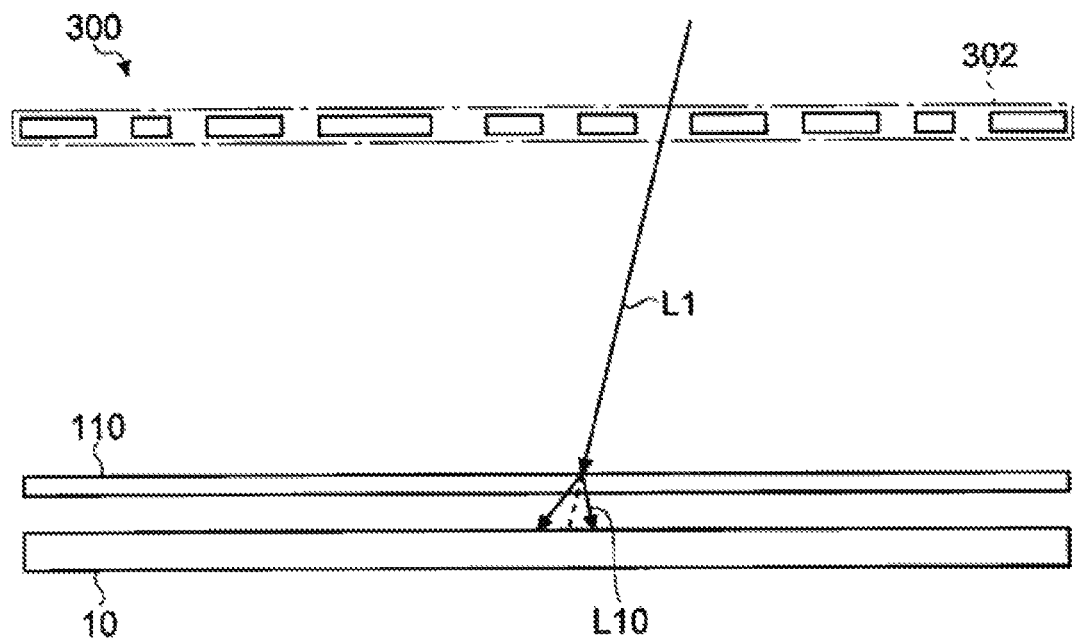
[ FIG. 17 ]
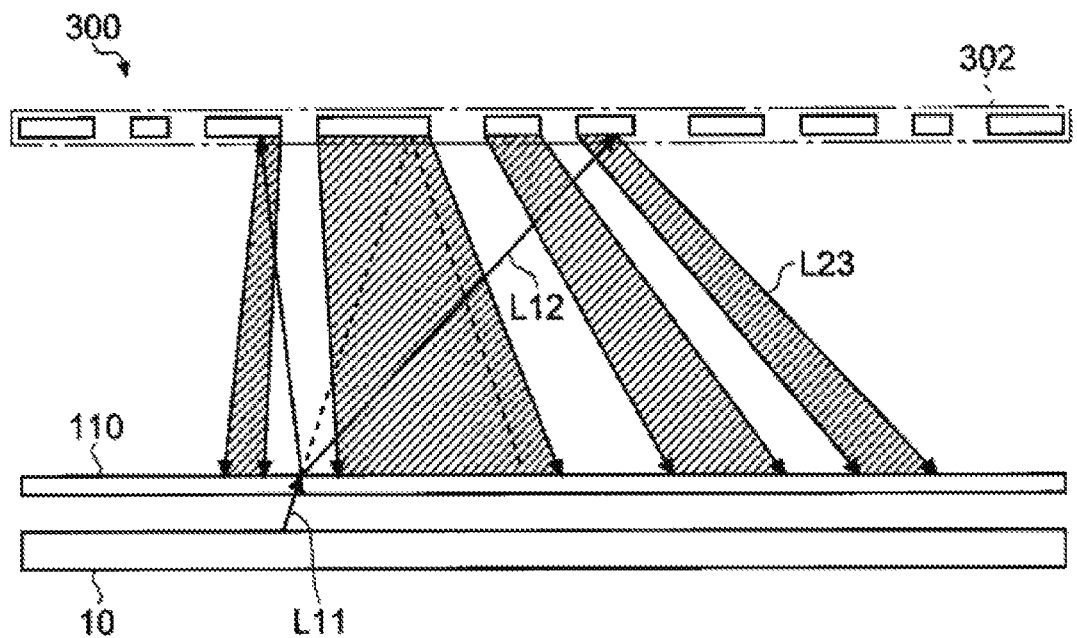

[ FIG. 18 ]
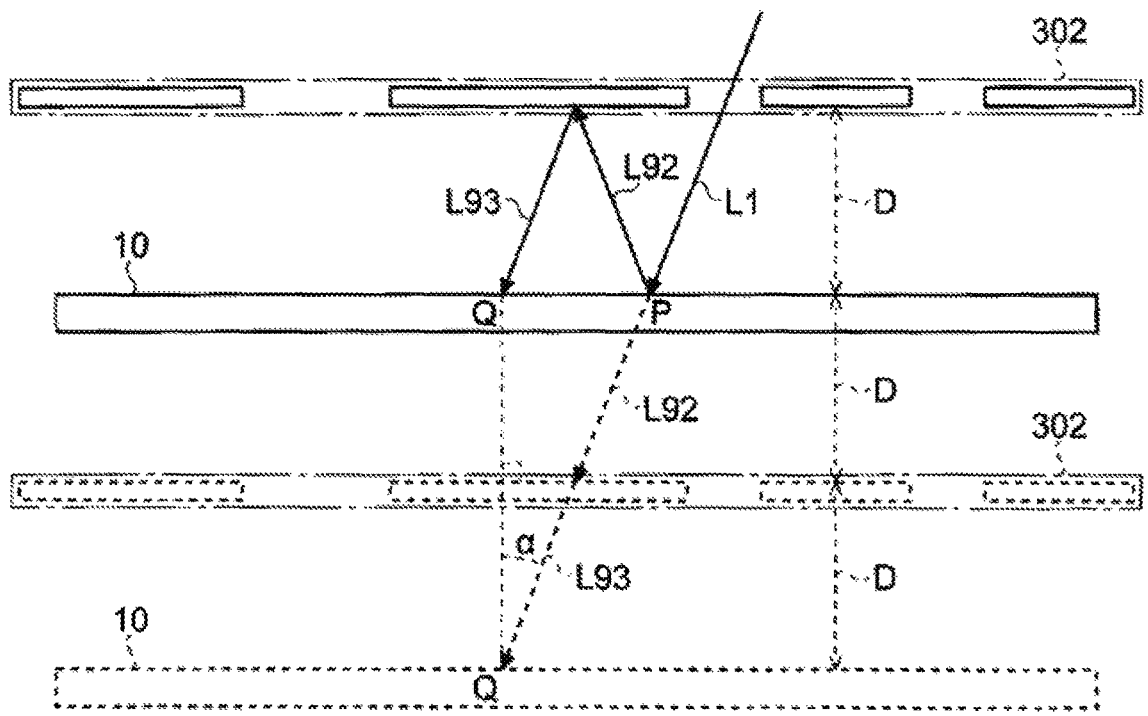
[ FIG. 19 ]
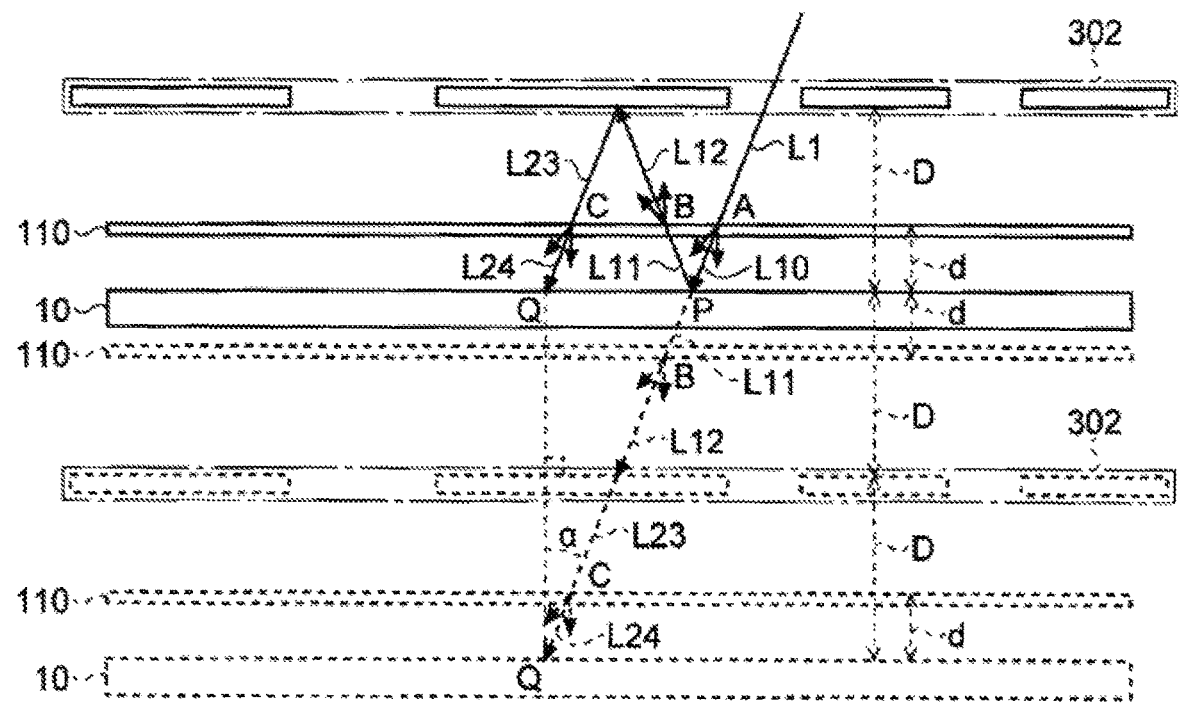

[FIG. 20]
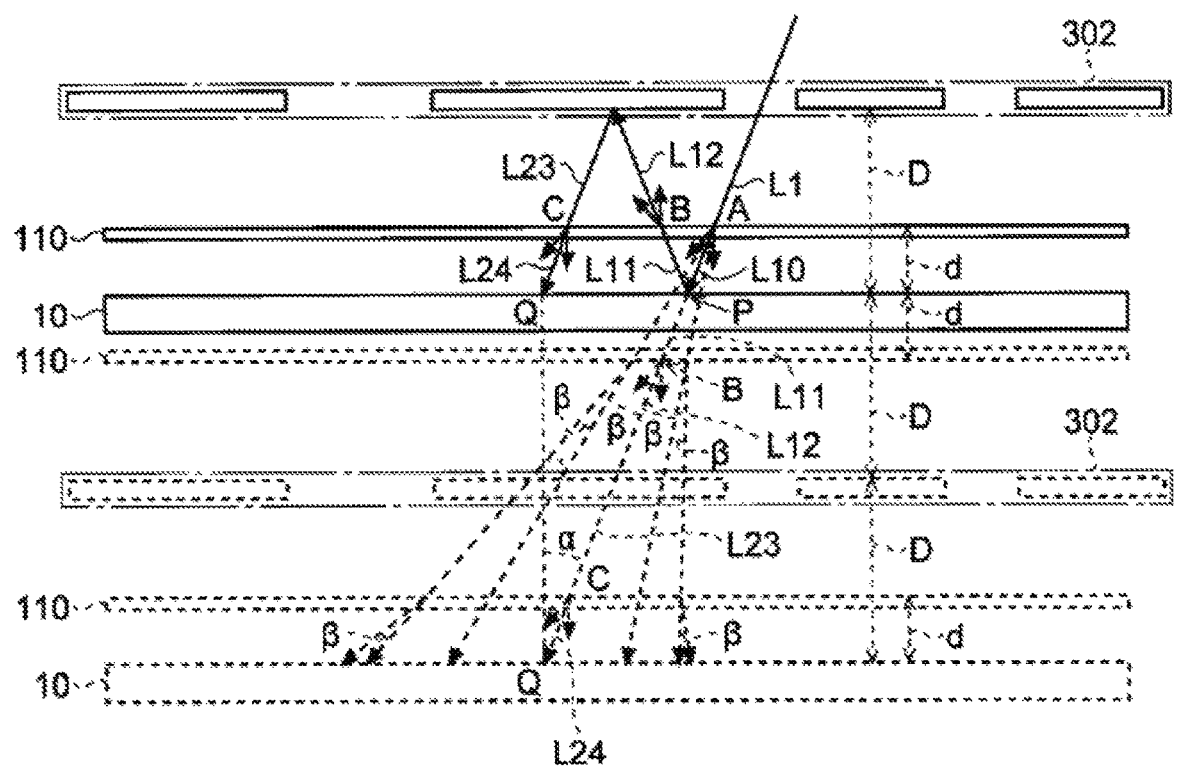

IMAGING DEVICE AND SOLID-STATE IMAGING DEVICE

CROSS REFERENCE TO RELATED APPLICATIONS

This application is a U.S. National Phase of International Patent Application No. PCT/JP2019/033232 filed on Aug. 26, 2019, which claims priority benefit of Japanese Patent Application No. JP 2018-197319 filed in the Japan Patent Office on Oct. 19, 2018. Each of the above-referenced applications is hereby incorporated herein by reference in its entirety.

TECHNICAL FIELD

The present disclosure relates to an imaging device and a solid-state imaging device.

BACKGROUND ART

An electromagnetic sensor such as an image sensor has been housed within a housing provided with an aperture for an incident wave to reduce an influence caused by undesired electromagnetic radiation (EMR). For example, a common camera has a structure in which an image sensor that generates image data by converting incident light into an electrical signal is housed within a housing including a light shielding material.

CITATION LIST

Patent Literature

PTL 1: U.S. Unexamined Patent Application Publication No. 2014/0284748
PTL 2: U.S. Unexamined Patent Application Publication No. 2013/0334423
PTL 3: U.S. Pat. No. 9,891,098
PTL 4: U.S. Pat. No. 9,645,008
PTL 5: International Publication No. WO2016/091757

SUMMARY OF THE INVENTION

Problems to be Solved by the Invention

However, an electromagnetic sensor is not a perfect absorber by itself, and reflects a portion of the incident wave. Further, the electromagnetic sensor itself can also be an EMR source (e.g., an infrared light source). An electromagnetic wave reflected by the electromagnetic sensor or radiated from the electromagnetic sensor, for example, is reflected by an inner wall of a housing that accommodates the electromagnetic sensor, re-enters the electromagnetic sensor, and becomes a factor of an artifact such as a multi-layered image or ringing caused by secondary reflection.

Accordingly, the present disclosure proposes an imaging device and a solid-state imaging device that are able to reduce an artifact caused by the secondary reflection.

Means for Solving the Problems

To solve the above issue, an imaging device according to an embodiment of the present disclosure includes a diffuser that converts incident light into scattered light whose diameter expands in accordance with a propagation distance and outputs the scattered light, and a light receiver that converts light diffused by the diffuser into an electric signal.

BRIEF DESCRIPTION OF DRAWINGS

FIG. 1 is a cross-sectional view of a schematic configuration example of a general imaging device.
FIG. 2 is a cross-sectional view illustrating a schematic configuration example of an imaging device according to a first embodiment.
FIG. 3 is a block diagram illustrating a schematic configuration example of an image sensor for invisible light according to the first embodiment.
FIG. 4 is a block diagram illustrating a schematic configuration example of an image sensor for visible light according to the first embodiment.
FIG. 5 is a diagram illustrating an example of a scattering angle profile of a diffuser panel according to the first embodiment.
FIG. 6 is a diagram for describing another example of the diffuser panel according to the first embodiment.
FIG. 7 is a diagram for describing reflected light in a case where the diffuser panel illustrated in FIG. 6 is used.
FIG. 8 is a diagram for describing up to a moment when light that has entered the imaging device according to the first embodiment enters a light reception surface of an image sensor.
FIG. 9 is a diagram for describing up to a moment when light that has been reflected on the image sensor in the imaging device according to the first embodiment is reflected on an inner wall of a housing and re-enters the image sensor.
FIG. 10 is a schematic view for describing up to a moment when light that has entered the imaging device according to the first embodiment enters the image sensor via a diffuser panel.
FIG. 11 is a schematic view for describing an artifact caused by secondary reflection according to the first embodiment.
FIG. 12 is a schematic cross-sectional view of a schematic configuration example of an image sensor according to a second embodiment.
FIG. 13 is a diagram for describing up to a moment when light that has been reflected on an entrance surface of a light receiver illustrated in FIG. 12 is outputted from the image sensor via a microlens.
FIG. 14 is a diagram for describing up to a moment when light that has entered an imaging device including no diffuser panel is reflected on a coded aperture and re-enters the image sensor.
FIG. 15 is a cross-sectional view of a schematic configuration example of an imaging device according to a third embodiment.
FIG. 16 is a schematic view for describing up to a moment when light that has entered the imaging device according to the third embodiment enters an image sensor via a diffuser panel.
FIG. 17 is a diagram for describing up to a moment when light that has been reflected on the image sensor in the imaging device according to the third embodiment is reflected on an inner wall of a housing and re-enters the image sensor.
FIG. 18 is a diagram for describing traveling of light that has entered an imaging device including no diffuser panel.
FIG. 19 is a diagram for describing traveling of light that has entered the imaging device according to the third embodiment.

FIG. 20 is a diagram for describing traveling of light that has passed through a diffuser panel in the imaging device according to the third embodiment.

MODES FOR CARRYING OUT THE INVENTION

In the following, some embodiments of the present disclosure are described in detail with reference to the drawings. It is to be noted that, in the following embodiments, components that have substantially the same functional configuration are indicated by the same reference signs, and thus redundant description thereof is omitted.

It is to be noted that description is given in the following order.
1. First Embodiment
   1.1 Schematic Configuration Example of Imaging Device
   1.2 Schematic Configuration Example of Image Sensor
   1.2.1 Image Sensor for Invisible Light
   1.2.2 Image Sensor for Visible Light
   1.3 Scattering Angle Profile of Diffuser Panel
   1.4 Position of Diffuser Panel
   1.5 Image Quality
   1.6 Artifact Caused by Secondary Reflection
   1.7 Workings and Effects
2. Second Embodiment
   2.1 Schematic Configuration Example of Image Sensor
   2.2 Workings and Effects
3. Third Embodiment
   3.1 Schematic Configuration Example of Imaging Device
   3.2 More Specific Studies on Artifact Caused by Secondary Reflection
   3.3 Workings and Effects 1. First Embodiment First, in describing a first embodiment, a general imaging device will be described. FIG. 1 is a cross-sectional view of a schematic configuration example of a general imaging device. It is to be noted that in the following, for clarity, electromagnetic radiation (EMR) is simply referred to as light. The light includes invisible light such as infrared rays (including far infrared rays), ultraviolet rays, and gamma rays, in addition to visible light.

As illustrated in FIG. 1, an imaging device 900 generally has a configuration in which an image sensor 910 is accommodated in a housing 901 provided with an aperture 903 for incident light L901 to enter, to reduce an influence caused by undesired light. Further, the aperture 903 of the housing 901 is provided with a lens 902, as an optical system for condensing the incident light L901.

In the imaging device 900 having such a configuration, in a case where the incident light L901 is visible light, a black diffusion material is used on an inner wall of the housing 901 to reduce an artifact caused by reflected light L902 which has been reflected on the image sensor 910 further being reflected on the inner wall of the housing 901 (secondary reflected light L903) and re-entering the image sensor 910 (an artifact caused by secondary reflection). The artifact caused by the secondary reflection may be, for example, image disturbance attributed to a multi-layered image, ringing, or the like, which is caused by the light that has been reflected on the image sensor being reflected on a surrounding reflective member and re-entering the image sensor.

However, in the case where the black diffusion material is used for the inner wall of the housing 901, a degree of freedom in designing the image sensor 910 is limited and a manufacturing cost is increased. In addition, there is an issue that it is difficult to say that it is very effective in a case where the incident light L901 is invisible light (e.g., infrared light), or for light that has been reflected on the lens 902, a filter, or the like.

Further, in a case where the incident light L901 is visible light and a coded aperture (also referred to as coded mask or binary mask) is used, it may be necessary that the coded aperture itself be manufactured using the black diffusion material, resulting in issues of increased manufacturing difficulty and an increased manufacturing cost.

Accordingly, in the first embodiment, a diffuser panel (also referred to as diffuser) is used as a configuration for reducing the artifact caused by secondary reflection. The use of the diffuser panel makes it possible to remarkably reduce the artifact caused by the secondary reflection even if a reflective member is disposed around the image sensor.

Further, in the present embodiment, the diffuser panel is disposed sufficiently close to a light reception surface of the image sensor, for example, such that light diffusion caused by the diffuser panel does not influence an image quality. In other words, incident light traveling toward the image sensor becomes light (hereinafter referred to as scattered light) whose diameter expands in accordance with a propagation distance by passing through the diffuser panel. Thus, if a distance from the diffuser panel to the light reception surface of the image sensor is long, an image formed on the light reception surface is blurred, and the image quality is lowered. Accordingly, in the present embodiment, the diffuser panel is disposed sufficiently close to the light reception surface of the image sensor such that the image formed on the light reception surface of the image sensor is not blurred. It is to be noted that in the present description, the light reception surface of the image sensor may be a surface where light entrance surfaces of light receiving elements each of which is included in a unit pixel to be described later are arranged.

Further, a distance from the diffuser panel to the reflective member is set such that an image of secondary reflected light, which is reflected on the image sensor and on the surrounding reflective member and re-enters the image sensor, is negligible. That is, the reflected light that has been reflected on the image sensor passes through the diffuser panel in a reverse direction, is reflected on the surrounding reflective member, passes through the diffuser panel again in a forward direction, and enters the image sensor; thus, setting the distance from the light reception surface of the image sensor 10 to the reflective member sufficiently long makes it possible to sufficiently expand the diameter of the secondary reflected light to reduce the intensity thereof before re-entering the image sensor. Thereby, the image of the secondary reflected light that enters the light reception surface is sufficiently blurred to be negligible, which makes it possible to reduce the artifact caused by the secondary reflection.

1.1 Schematic Configuration Example of Imaging Device

FIG. 2 is a cross-sectional view illustrating a schematic configuration example of an imaging device according to the present embodiment. As illustrated in FIG. 2, an imaging device 100 has a configuration in which an image sensor 10 is accommodated in a housing 101 provided with an aperture 103 for light L1 to enter. Further, a lens 102 is provided on the aperture 103 of the housing 101 as an optical system for condensing the light L1. In addition, the imaging device 100 includes a diffuser panel 110 disposed close to a light reception surface of the image sensor 10. It is to be noted that the term "close to the light reception surface of the image sensor 10" may mean, for example, that it is closer to the light reception surface of the image sensor 10 than a top surface (hereinafter, also referred to as ceiling) 101a of an inner wall of the housing 101. Further, on the light reception surface of the image sensor 10, light receiving elements (also referred to as light receivers) 132 each of which is included in a unit pixel 131 to be described later are arranged in a two-dimensional matrix in a row direction and a column direction.

In such a configuration, in the following description, for example, a distance from the light reception surface of the image sensor 10 to the top surface of the inner wall of the housing 101 is denoted by D, and a distance from the light reception surface of the image sensor 10 to the diffuser panel 110 (e.g., a surface of the diffuser panel 110 which the incident light enters in the forward direction) is denoted by d.

It is to be noted that although FIG. 2 and the following drawings illustrate that the top surface of the image sensor 10 and the light reception surface coincide with each other, they do not necessarily coincide with each other. For example, in a case where the light receiving element 132 to be described later is formed at a predetermined depth from the top surface of the image sensor 10, or in a case where a microlens array or the like is provided on the top surface of the image sensor 10, the light reception surface of the image sensor 10 is at a position deeper than the top surface of the image sensor 10. Further, light that has entered the image sensor 10 may be reflected not only on the light reception surface, but may also be reflected on the entrance surface of the light of the image sensor 10 itself. In the following description, the light reception surface and the entrance surface are not distinguished from each other in order to simplify the description.

1.2 Schematic Configuration Example of Image Sensor

Next, a schematic configuration example of the image sensor 10 will be described. Here, as described above, the light to be detected by the image sensor 10 according to the present embodiment includes: visible light; and invisible light such as infrared rays (including far infrared rays), ultraviolet rays, and gamma rays.

For example, in a case where the light L1 to enter is visible light, the image sensor 10 is configured as a sensor for visible light. In this case, the image sensor 10 includes, as a light receiving element, for example, an imaging element such as a photodiode that photoelectrically converts the light that has entered to generate electric charges.

In contrast, in a case where the light L1 to enter is invisible light, e.g., infrared light, that is, in a case where the image sensor 10 is a sensor for infrared light, the image sensor 10 uses, as the light receiving element, a thermal infrared detection element such as a pyroelectric sensor, a thermopile, and a bolometer, or a cooled or uncooled quantum-type infrared detection element.

In the following, a schematic configuration example of the image sensor 10 whose detection target is invisible light (infrared light (including far-infrared light)) and a schematic configuration example of the image sensor 10 whose detection target is visible light will be described with examples.

1.2.1 Image Sensor for Invisible Light

FIG. 3 is a block diagram illustrating a schematic configuration example of an image sensor for the infrared light (including the far-infrared light) according to the first embodiment. As illustrated in FIG. 3, an image sensor 10A for invisible light includes an element array 3, a signal processing circuit 5, and a controller 1.

The element array 3 includes, for example, a plurality of light receiving elements 132 arranged in the two-dimensional matrix in the row direction and the column direction. In FIG. 3, some of the rows and columns in the pixel array 13 are omitted for simplicity of the description; however, several tens to several thousands of light receiving elements 132 may be disposed in each row and each column, for example. The lens 102 is disposed at a position where an image of the light L1 is formed on the light reception surface on which the light receiving elements 132 are arranged.

The controller 1 controls reading of an electric signal from the light receiving element 132. Specifically, the controller 1 causes the element array 3 to output, to the signal processing circuit 5, the electric signal generated by application of the light L1 to the light receiving element 132 for each element or for each row, for example.

For example, in the case where a bolometer is used as the light receiving element 132, the controller 1 reads an electric signal indicating a difference in a resistance value due to a temperature increase in the light receiving element caused by absorbing the incident light from each of the light receiving elements 132 of the element array 3. Further, in the case where a thermopile is used as the light receiving element, the controller 1 reads an electric signal of a voltage value proportional to a local temperature difference or a temperature gradient caused by absorbing the incident light from each of the light receiving elements 132 of the element array 3.

The signal processing circuit 5 processes the electric signal outputted from the element array 3 by the controller 1 to generate image data based on an infrared image. It is to be noted that in the case where the thermal infrared detection element is used as the light receiving element 132, the light receiving element 132 itself may include an AD (Analog-to-Digital) converter that converts an analog electric signal into a digital electric signal. In such a case, the signal processing circuit 5 digitally processes the electric signal outputted from the element array 3 to generate the image data. However, in a case where the light receiving element 132 itself does not include the AD converter that converts an analog electric signal into a digital electric signal, the signal processing circuit 5 converts the analog electric signal outputted from the element array 3 into a digital value, and thereafter digitally processes the digital value to generate the image data.

1.2.2 Image Sensor for Visible Light

FIG. 4 is a block diagram illustrating a schematic configuration example of an image sensor for the visible light according to the first embodiment. As illustrated in FIG. 4, an image sensor 10B for visible light includes a pixel array 13, a signal processing circuit 15, a reference voltage generator 17, and an output circuit 19.

Further, a driving controller is provided on an outer side of the pixel array 13 for sequentially reading analog pixel signals from respective unit pixels 131 and outputting the analog pixel signals as digital image data. The driving controller may include, for example, a horizontal transfer circuit 18, a pixel driving circuit 12, a timing control circuit 11, and the like.

The pixel array 13 includes the plurality of unit pixels 131 arranged in the two-dimensional matrix in the row direction and the column direction. In FIG. 4, some of the rows and columns in the pixel array 13 are omitted for simplicity of the description; however, several tens to several thousands of unit pixels 131 may be disposed in each row and each column, for example.

Each unit pixel 131 includes, for example, a light receiving element such as a photodiode that photoelectrically converts the light that has entered to generate electric charges (for convenience of description, the reference numeral of the light receiving element is also denoted as "132"), and a pixel circuit that generates a pixel signal corresponding to an amount of electric charges generated in the light receiving element 132. The pixel circuit includes, for example: a transfer transistor that transfers the electric charges generated in the light receiving element 132 to a predetermined node (floating diffusion region) functioning as an electric charge storage; a reset transistor that discharges the electric charges stored in the predetermined node and/or the light receiving element 132; an amplifier transistor that causes a pixel signal of a voltage value corresponding to the amount of electric charges stored in the predetermined node to appear in a vertical signal line VSL; and a selection transistor that switches a connection between the amplifier transistor and the vertical signal line VSL.

Further, each unit pixel 131 is coupled to the pixel driving circuit 12 via a pixel drive line LD for pixel selection and to the signal processing circuit 15 via the vertical signal line VSL. It is to be noted that, in the present description, the pixel drive line LD refers to all wiring lines that enter the respective unit pixels 131 from the pixel driving circuit 12. For example, the pixel drive line LD may include a control line that propagates various pulse signals (e.g., pixel reset pulses, transfer pulses, drain line control pulses, etc.) for driving the unit pixel 131.

The signal processing circuit 15 includes: an analog circuit such as an AD (Analog to Digital) converter that converts an analog pixel signal read from the unit pixel 131 into a digital pixel signal; and a logic circuit that performs a digital process such as a CDS (correlated double sampling) process on the basis of the pixel signal converted into a digital value by the AD converter. It is to be noted that the AD converter may be provided on a one-to-one basis to each unit pixel 131, may be provided on a one-to-one basis to each pixel group including a plurality of unit pixels 131, or may be provided on a one-to-one basis to each column in the pixel array 13.

The reference voltage generator 17 supplies the signal processing circuit 15 with a reference voltage REF for converting the analog pixel signal read from each unit pixel 131 via the vertical signal line VSL into the digital pixel signal.

The timing control circuit 11 outputs an internal clock that is necessary for an operation of each section, a pulse signal that provides a timing at which each section starts its operation, and the like. Further, the timing control circuit 11 receives data that commands a master clock, an operation mode, etc. from an outside or outputs data that includes information of the image sensor 10B.

For example, the timing control circuit 11 outputs, to the pixel driving circuit 12, the pulse signal providing a timing for reading the pixel signal from each unit pixel 131. Further, timing control circuit 11 outputs, to the horizontal transfer circuit 18, a column address signal for sequentially reading pixel signals (digital voltage values) of signal components that have been AD-converted by the AD converter from the signal processing circuit 15 for each column.

In addition, the timing control circuit 11 supplies, as the internal clock, a clock having the same frequency as a master clock inputted from the outside, a clock obtained by dividing the clock by two, a clock of a lower speed obtained by dividing the clock by a larger number, or the like, to each section in the image sensor 10B, for example, the horizontal transfer circuit 18, the pixel driving circuit 12, the signal processing circuit 15, and the like. Hereinafter, a clock divided by two or a clock having a frequency lower than or equal to that of the clock divided by two are each collectively referred to as low-speed clock.

The pixel driving circuit 12 selects a row of the pixel array 13 and outputs a pulse necessary for driving the row to the pixel drive line LD. For example, the pixel driving circuit 12 includes a vertical decoder that defines a vertical read row (selecting a row of the pixel array 13) and a vertical driver that supplies a pulse to and drives the pixel drive line LD to the unit pixel 131 on a read address (row direction) defined by the vertical decoder. It is to be noted that the vertical decoder selects, in addition to a row from which the pixel signal is read, a row for an electronic shutter.

The horizontal transfer circuit 18 performs, in accordance with the column address signal inputted from the timing control circuit 11, a shift operation (scanning) of reading a digital pixel signal from the AD converter of the read column specified by the column address signal to a horizontal signal line HSL.

The output circuit 19 outputs the digital pixel signal read by the horizontal transfer circuit 18 to the outside as image data.

The signal processing circuit 15 may include an AGC (Auto Gain Control) circuit having a signal-amplifying function as necessary.

Further, the image sensor 10B may be provided with a clock converter that generates a pulse having a clock frequency higher than the inputted clock frequency. In that case, the timing control circuit 11 may generate the internal clock on the basis of an input lock (e.g., a master clock) inputted from the outside or a high-speed clock generated by the clock converter.

It is to be noted that the image sensor 10B for visible light is not limited to the above-mentioned CMOS (Complementary Metal Oxide Semiconductor) type image sensor, and it is possible to apply various image sensors such as CCD (Charge Coupled Device) type, for example.

1.3 Scattering Angle Profile of Diffuser Panel

The diffuser panel 110 according to the present embodiment converts light that has entered into scattered light whose diameter expands in accordance with a propagation distance and outputs the scattered light, for example, with a predetermined scattering angle profile $\rho(\alpha)$. FIG. 5 is a diagram illustrating an example of a scattering angle profile of a diffuser panel according to the present embodiment. It is to be noted that the diffuser panel 110 according to the present embodiment includes, for example, a normalized circularly symmetric scattering angle profile $\rho(\alpha)$. Further, in FIG. 5, a horizontal axis represents a deviation angle $\alpha$ from an optical axis of the incident light, and a vertical axis represents a light intensity of the scattered light outputted from the diffuser panel. It is to be noted that the incident light may be visible light or invisible light.

The scattering angle profile $\rho(\alpha)$ of the diffuser panel 110 has a normalized circularly symmetric Gaussian distribution as illustrated in FIG. 5. The total light intensity of the scattered light is normalized, for example, as in the following Expression (1).

[Math. 1]

$$2\pi \int_0^{\frac{\pi}{2}} \rho(\alpha)\alpha d\alpha = 1 \tag{1}$$

Further, a relative light intensity P(β) where a spread angle of the scattered light is 2β may be expressed by the following Expression (2).

[Math. 2]

$$P(\beta)=2\pi\int_0^\beta \rho(\alpha)\alpha d\alpha \tag{2}$$

It is to be noted that in this example, the diffuser panel 110 has a normalized circularly symmetric scattering angle profile, but the present disclosure is not limited thereto. For example, it is possible to use various diffuser panels, such as a diffuser panel provided with a scattering angle profile that is asymmetric with respect to the optical axis.

Further, it is also possible to use, as the diffuser panel 110, a diffuser panel that diffuses light in a predetermined direction determined by designing in advance and outputs the light. For example, as illustrated in FIG. 6, it is also possible to use a diffuser panel 110A that outputs the light L1 while diffusing the light L1 in a direction perpendicular to the light reception surface of the image sensor 10.

The use of such a diffuser panel 110A makes it possible to improve a sensitivity of the image sensor 10. Further, as illustrated in FIG. 7, the diffuser panel 110A is also able to diffuse light L11 reflected on the image sensor 10 and directed toward the lens 102, which makes it possible to reduce the artifact caused by the secondary reflection.

1.4 Position of Diffuser Panel

Subsequently, a position of the diffuser panel 110 will be described. FIG. 8 is a diagram for describing up to a moment when light that has entered the imaging device according to the present embodiment enters the light reception surface of the image sensor. FIG. 9 is a diagram for describing secondary reflected light in the imaging device according to the present embodiment. It is to be noted that FIG. 9 illustrates up to a moment when the light L11 that has been reflected on the image sensor 10 is reflected on the ceiling 101a of the housing 101 and re-enters the image sensor 10.

As illustrated in FIG. 8, the light L1 that has entered the inside of the housing 101 of the imaging device 100 via the lens 102 is converted into light (scattered light) L10 whose diameter expanded in accordance with a propagation distance by passing through the diffuser panel 110, and enters the image sensor 10.

Accordingly, by making the distance (e.g., the shortest distance) d from the light reception surface of the image sensor 10 to the diffuser panel 110 (e.g., the surface of the diffuser panel 110 which the incident light enters in the forward direction) sufficiently short, i.e., by disposing the diffuser panel 110 sufficiently close to the light reception surface of the image sensor 10, it is possible to reduce blurring of the image formed on the light reception surface and suppress deterioration of the image quality. For example, by disposing the diffuser panel 110 and the image sensor 10 close to each other to such an extent that the light L10 that has entered the diffuser panel 110 in the vicinity of the center of each light receiving element 132 and has diffused does not enter adjacent light receiving elements 132, it is possible to reduce the blurring of the image formed on the light reception surface and suppress deterioration of the image quality.

Further, as described above, the light receiving element 132 of the image sensor 10 is not a perfect absorber by itself, and reflects a portion of the light L10 that has entered. As illustrated in FIG. 9, the light (reflected light) L11 that has been reflected on the image sensor 10 mainly passes through the diffuser panel 110 in the opposite direction, is reflected on the ceiling 101a of the housing 101, and then passes through the diffuser panel 110 and enters the image sensor 10 again. In this case, the light L11 that has been reflected on the image sensor 10 is converted into light L12 which is scattered light by passing through the diffuser panel 110 in the opposite direction. Similarly, light L13 that has been reflected on the ceiling 101a of the housing 101 is converted into light L14 which is scattered light by passing through the diffuser panel 110 in the forward direction.

Accordingly, it is possible to widen a diameter of the light L14 that enters the light reception surface of the image sensor 10 by setting a length of, out of the optical path of the light L11 that is reflected on the image sensor 10 and re-enters the image sensor 10, at least the optical path (e.g., the optical path of the light L12 and L13 in FIG. 9) of the light that passes through the diffuser panel 110 in the opposite direction, is reflected on the ceiling 101a of the housing 101, and re-enters the diffuser panel 110 in the forward direction to be sufficiently long. Specifically, by setting the distance (e.g., the shortest distance) D from the light reception surface of the image sensor 10 to the ceiling 101a of the housing 101 to be sufficiently long, it is possible to sufficiently widen the diameter of the light L14 that enters the light reception surface. Thus, it becomes possible to reduce the intensity of the light L14 that enters the light reception surface, which makes it possible to sufficiently blur the image of the light L14 that has entered to a negligible extent.

It is to be noted that the lower limit of the distance d from the light reception surface of the image sensor 10 to the diffuser panel 110 is determined depending on, for example, a manufacturing process of the image sensor 10. Therefore, in designing the imaging device 100, it is preferable to determine the distance d from the light reception surface of the image sensor 10 to the diffuser panel 110 first, and then select a diffuser panel 110 having a scattering angle profile that is able to sufficiently reduce the artifact caused by the secondary reflection.

1.5 Image Quality

FIG. 10 is a schematic view for describing up to a moment when light that has entered the imaging device according to the present embodiment enters the image sensor via the diffuser panel.

In the present embodiment, in order to suppress the deterioration of the image quality due to the disposition of the diffuser panel 110, it is preferable that a scattering angle β be sufficiently small so that the relative light intensity P(β) in the above Expression (2) approaches 1. As illustrated in FIG. 10, for example, in a case where a pixel pitch of the image sensor 10 is 2r, the scattering angle β of the diffuser panel 110 may be set such that a radius r of a spot formed on the light reception surface of the image sensor 10 by half of the light L10 satisfies the following Expression (3). It is to be noted that in the present description, the pixel pitch may be the pitch of the light receiving elements 132. The pixel pitch may have a size, for example, equal to a size of the light receiving element 132.

[Math. 3]

$$P(\beta) = 2\pi \int_0^\beta p(\alpha)\alpha d\alpha > 0.5, \text{ where } \beta = \arctan\left(\frac{r}{d}\right) \quad (3)$$

Expression (3) expresses a case where the light L1 enters perpendicularly to the diffuser panel 110. However, a shape and a size of the spot formed on the light reception surface of the image sensor 10 by the light L10 diffused by the diffuser panel 110 also depend on an incident angle θ of the light L1 to the diffuser panel 110.

In a case where the incident angle θ and the scattering angle β are sufficiently small, a diameter of the spot formed by the light L10 on the light reception surface of the image sensor 10 is substantially proportional to d/cos θ. This indicates that the larger the incident angle θ, the more blurred is the image that the light L10 diffused by the diffuser panel 110 forms on the light reception surface of the image sensor 10.

Accordingly, considering a case where the light L1 enters the diffuser panel 110 in an inclined manner, the above-mentioned Expression (3) may be modified as in the following Expression (4). It is to be noted that in Expression (4), $f$ is a maximum incident angle of the light L1.

[Math. 4]

$$P(\beta) = 2\pi \int_0^\beta p(\alpha)\alpha d\alpha > 0.5, \text{ where } \beta = \arctan\left(\frac{r \times \cos(\max(\theta))}{d}\right) \quad (4)$$

Thus, the diffuser panel 110 has a spatially non-uniform profile, that is, the smaller the incident angle θ, the stronger the diffuser panel 110 diffuses the surrounding of the spot. Further, the diffuser panel 110 also has a function that the distance between the light reception surface of the image sensor 10 and the diffuser panel 110 varies depending on the incident angle θ. That is, the larger the incident angle θ, the shorter the distance from the light reception surface of the image sensor 10 to the diffuser panel 110.

1.6 Artifact Caused by Secondary Reflection

FIG. 11 is a schematic view for describing the artifact caused by the secondary reflection according to the present embodiment. For the sake of simplicity, the description ignores spreading of the light L13 that has been reflected on the ceiling 101a of the housing 101, the spreading being due to the diffusion caused by the diffuser panel 110 when the light L13 re-enters the image sensor 10. This is because the optical path length of the light that passes through the diffuser panel 110 and re-enters the image sensor 10 is sufficiently shorter than the optical path length of the light L13 that is reflected by the image sensor 10 and re-enters the image sensor 10, and even if the influence thereof is ignored, the result of the consideration is hardly influenced.

In order to reduce the artifact caused by the secondary reflection in the present embodiment, it may be necessary that ρ(α) in the above Expressions (1) to (3) be a constant function as much as possible. However, it is also necessary that Expression (3) or Expression (4) described above be satisfied.

For example, in a case where α≤β, assuming that ρ(α) is a constant C, it is possible that the constant C is determined by the following Expression (5) on the basis of the above Expression (3) or Expression (4).

[Math. 5]

$$2\pi \int_0^\beta C\alpha d\alpha = \pi C\beta^2 > 0.5 \rightarrow C > \frac{1}{2\pi\beta^2} \quad (5)$$

Here, a light propagation distance D' of the light L10 that is reflected on the image sensor 10 and re-enters the image sensor 10 is more than or equal to the distance obtained by subtracting the distance d from twice the distance D, that is, D'≥D+(D−d).

In this propagation distance D', more than a half of the light entering the image sensor 10 is substantially uniformly distributed in a region of a radius R that is determined by the following Expression (6).

[Math. 6]

$$R \geq (2D - d)\tan(\beta) = (2D - d)\frac{r}{d} \quad (6)$$

It is appreciated from Expression (6) that it is possible to make the radius R much larger than the radius r by setting the distance D to be sufficiently large relative to the distance d. Thus, it is appreciated that by making the distance d from the light reception surface of the image sensor 10 to the diffuser panel 110 sufficiently short, that is, by disposing the diffuser panel 110 sufficiently close to the light reception surface of the image sensor 10, it is possible to reduce blurring of the image formed on the light reception surface and suppress deterioration of the image quality.

1.7 Workings and Effects

As described above, in the present embodiment, the diffuser panel 110 is disposed close to the light reception surface of the image sensor 10 accommodated in the housing 101. This makes it possible to sufficiently blur the image of the light L14 that is reflected on the image sensor 10 and on the surrounding reflective member (e.g., ceiling 101a) and re-enters the image sensor 10 to a negligible extent, thereby making it possible to reduce the artifact caused by the secondary reflection.

Further, in the present embodiment, the diffuser panel 110 is disposed sufficiently close to the light reception surface of the image sensor 10. This causes the blurring of the image of the light L10 formed on the light reception surface of the image sensor 10 to be reduced, which makes it possible to suppress deterioration of the image quality.

2. Second Embodiment

Next, a second embodiment will be described in detail by referring to the drawings. In the first embodiment, an example of the case has been described where the diffuser panel 110 is disposed close to a chip of the image sensor 10. In contrast, the second embodiment will illustrate an example of a case where a diffuser panel is embedded in a chip of an image sensor.

In the present embodiment, for example, the image sensor 10 included in the imaging device 100 exemplified in the first embodiment is replaced by an image sensor 20 to be described later. It is to be noted that the image sensor 20 may be a sensor for visible light or a sensor for invisible light.

2.1 Schematic Configuration Example of Image Sensor

FIG. 12 is a schematic cross-sectional view illustrating a schematic configuration example of the image sensor according to the present embodiment. It is to be noted that FIG. 12 illustrates an example of a cross-sectional structure of one unit pixel in the image sensor 20. Further, FIG. 12 omits configurations of pixel circuits in the unit pixel, for example, a transfer transistor, a reset transistor, an amplifier transistor, a selection transistor, and the like.

As illustrated in FIG. 12, the image sensor 20 has a configuration in which a filter 23, a diffuser 210, and a light receiver 24 are formed on a semiconductor substrate 21 of a silicon substrate or the like, for example. A microlens 22 for each unit pixel is provided on a light entrance surface of the semiconductor substrate 21.

The microlens 22 condenses, for example, light L2 that has entered on the light receiver 24. The filter 23 is provided with, for example, a wavelength selection function of transmitting light having a particular wavelength. The diffuser 210 diffuses light that has entered with a predetermined scattering angle profile and outputs scattered light L20, similarly to the diffuser panel 110 according to the embodiment described above. The light receiver 24 images light that has entered and generates electric charges, similarly to the light receiving element 132 according to the embodiment described above.

In such a configuration, the diffuser 210 is disposed, for example, between the filter 23 and the light receiver 24. For example, the diffuser 210 is located immediately below the filter 23. With such a configuration, it becomes possible to sufficiently shorten a distance d from a light entrance surface of the light receiver 24 to the diffuser 210 (e.g., the surface of the diffuser 210 which the incident light enters in the forward direction), that is, to dispose the diffuser panel 110 sufficiently close to the light reception surface of the image sensor 10. Thereby, for example, similarly to first embodiment, it is possible to reduce blurring of an image formed on the light reception surface of the image sensor 20 and suppress deterioration of an image quality. Further, in a case where the image sensor 20 is a front-side illumination type having an element forming surface of the semiconductor substrate 21 as the light entrance surface, the diffuser 210 is located on a reflective member such as a wiring line or the like formed on the element forming surface; thus, there is also an advantage that it becomes possible to reduce crosstalk due to reflection on the reflective member.

More specifically, as illustrated in FIG. 12, the light L2 that has entered the microlens 22 enters the diffuser 210 via the filter 23 formed on the semiconductor substrate 21, thereby being converted into the scattered light L20 having a scattering angle $\beta$. Thereafter, the scattered light L20 propagates inside the semiconductor substrate 21, thereby entering the light receiver 24 which is separated from the diffuser 210 by the distance d. If an incident angle $\theta$ of the light L1 is sufficiently small, a diameter $2r$ of the scattered light L20 upon entering the light receiver 24 is approximately $r=d\times\sin\beta$. More precisely, it is possible to be determined using Expression (3) or Expression (4) according to the first embodiment described above.

FIG. 13 is a diagram for describing up to a moment when light that has been reflected on the entrance surface of the light receiver illustrated in FIG. 12 is outputted from the image sensor via the microlens.

Light L21 that has been reflected on the entrance surface of the light receiver 24 is converted into scattered light L22 having a scattering angle $\beta$ by passing through the diffuser 210 in the opposite direction, and then enters the microlens 22. The microlens 22 having a convex shape reduces the scattering angle $\beta$ of the scattered light L22 that has entered using its light condensing function. Consequently, light L23 having a scattering angle $\beta 1$ smaller than the scattering angle $\beta$ is outputted from the microlens 22.

Here, assuming that the light receiver 24 is disposed at a focal plane separated from an optical center O of the microlens 22 by a focal distance F and the diffuser 210 is disposed at a position separated from the optical center O by a distance L shorter than the focal distance F, an exit surface of the light L23 in a case where it is assumed that there is no diffuser 210 is, for example, a surface separated from the optical center O of the microlens 22 by a distance I shorter than the focal distance F, from the following Expression (7) on the basis of a thin lens approximation.

[Math. 7]

$$\frac{1}{L} + \frac{1}{I} = \frac{1}{F} \tag{7}$$

From Expression (7), the distance I may be determined by the following Expression (8).

[Math. 8]

$$I = \frac{LF}{L-F} \tag{8}$$

Since $0 \leq L < F$ is satisfied, the distance I is a negative value at all times, and the absolute value of the distance I is smaller than the distance L at all times. The exit surface of the light L23 in the case where it is assumed that there is no diffuser 210 is located between the light receiver 24 and the diffuser 210 which is located at the distance I determined by Expression (8).

Further, on the basis of Expression (8), the scattering angle $\beta 1$ of the light L23 may be approximated by the following Expression (9).

[Math. 9]

$$L \times \sin\beta \approx I \times \sin\beta 1 \tag{9}$$

Here, in a case where the scattering angles $\beta$ and $\beta 1$ are sufficiently small, $\beta 1$ may be determined by the following Expression (10) on the basis of Expression (9).

[Math. 10]

$$L \times \beta \approx I \times \beta 1 \rightarrow \beta 1 \approx \frac{L \times \beta}{|I|} \tag{10}$$

From the above, it is appreciated that in order to reduce the decrease in the scattering angle $\beta 1$ of the light L23 from the scattering angle $\beta$, it is preferable to dispose the diffuser 210 as close as possible to the optical center O of the microlens 22.

2.2 Workings and Effects

As described above, even in the case where the diffuser 210 is embedded in the chip of the image sensor 20, similarly to the first embodiment, it is possible to sufficiently blur the image of the light that has been reflected on the entrance surface of the light receiver 24 and on the surrounding reflective member (e.g., ceiling 101a) and has re-entered the light receiver 24 to a negligible extent, and it is possible to reduce blurring of the image of the light formed on the light receiver 24. This makes it possible to achieve reduction in the artifact caused by the secondary reflection and suppression of deterioration of the image quality.

It is to be noted that, although the above description gives an example of the case where the diffuser 210 is disposed between the filter 23 and the light receiver 24, the present disclosure is not limited thereto, and, for example, the diffuser 210 may be disposed between the filter 23 and the microlens 22. For example, in a case where the filter 23 or another member formed on the semiconductor substrate 21 has reflectivity, the filter 23 or the other member may be disposed between the diffuser 210 and the light receiver 24, which makes it possible to reduce blurring of the image formed on the light reception surface of the image sensor 20 and suppress the deterioration of the image quality, and additionally to reduce crosstalk between unit pixels that are adjacent to each other.

Further, instead of the filter 23 and the diffuser 210, it is also possible to use a layer in which a filter and a diffuser are integrated. Also in this case, similarly to the above-described structure, it is possible to sufficiently shorten the distance d from the light entrance surface of the light receiver 24 to the diffuser 210, which makes it possible to reduce the blurring of the image formed on the light reception surface of the image sensor 20 and suppress the deterioration of the image quality.

Other configurations, operations, and effects may be similar to those of the above-described embodiment, and therefore detailed description thereof is omitted.

3. Third Embodiment

Next, a third embodiment will be described in detail by referring to the drawings. In the first and second embodiments described above, examples of the case have been described where the imaging device 100 includes the lens 102. In contrast, the third embodiment will illustrate an example of a case where an imaging device includes a coded aperture as an optical system in place of the lens 102.

The coded aperture is a mask-shape member provided with an optical aperture having a random shape which is not geometric or circular. The coded aperture is a diaphragm portion used in a coding imaging technique to adjust a brightness, a depth of field, and the like of an image by controlling PSF (point spread function).

For the coded aperture, materials having a high light-absorbing property are not necessarily used because of its easiness of processing, cost, and the like. For example, in a case where the coded aperture has high reflectivity, as illustrated in FIG. 14, the light L902 that has been reflected on the image sensor 910 is reflected on a coded aperture 912 with high reflectance and re-enters the image sensor 910. As a result, an artifact caused by the secondary reflection attributed to reflected light L913 having a high light intensity strongly appears in the image captured by the image sensor 910.

Accordingly, in the present embodiment, similarly to the above-described first embodiment, a diffuser panel is disposed sufficiently close to the light reception surface of the image sensor.

3.1 Schematic Configuration Example of Imaging Device

FIG. 15 is a cross-sectional view illustrating a schematic configuration example of the imaging device according to the present embodiment. As illustrated in FIG. 15, an imaging device 300 includes, for example, a configuration in which the diffuser panel 110 is disposed between the image sensor 10 and a coded aperture 302 which is located on a light reception surface side of the image sensor 10. The image sensor 10 may be similar to, for example, the image sensor 10 illustrated in the first embodiment or the image sensor 20 illustrated in the second embodiment.

As illustrated in FIG. 16, the light L1 entered from the optical aperture of the coded aperture 302 is diffused by the diffuser panel 110 and enters the image sensor 10 as the light L10. Similarly to first embodiment, the diffuser panel 110 is disposed close to the light reception surface of the image sensor 10. This makes it possible to reduce blurring of the image formed on the light reception surface and suppress deterioration of the image quality.

Further, as illustrated in FIG. 17, the light L11 that has been reflected on the image sensor 10 is converted into the light L12 whose diameter expands in accordance with a propagation distance by passing through the diffuser panel 110 in the opposite direction. The light L12 is reflected on a light-shielding portion of the coded aperture 302 and returns to the diffuser panel 110. Accordingly, accordingly, an image of the light L23 (oblique line portion in FIG. 17) that re-enters the diffuser panel 110 in the forward direction is an image obtained by enlarging a pattern of the coded aperture 302.

Therefore, similarly to the first embodiment, by setting the length of the optical path of the light that passes through the diffuser panel 110 in the opposite direction and re-enters the diffuser panel 110 in the forward direction to be sufficiently long, it is possible to sufficiently expand the diameter of the light L23 to reduce its intensity before re-entering the image sensor 10. This makes it possible to reduce the artifact caused by the secondary reflection.

It is to be noted that in a case where a characteristic of the coded aperture 302 is sufficiently small, effects due to diffraction of the light also contributes to sufficiently expanding the diameter of light L23.

3.2 More Specific Studies on Artifact Caused by Secondary Reflection

Next, the artifact caused by the secondary reflection in the case where the coded aperture 302 is used will be described in more detail. In the following description, it is assumed that a reflectance Rs on the light reception surface of the image sensor 10 is 0.3, and a reflectance Ms on the light-shielding portion of the coded aperture 302 is 0.9. Further, it is assumed that the incident angle $\theta$ of the incident light L901 and L1 is 20°.

FIG. 18 is a diagram for describing traveling of light that has entered an imaging device including no diffuser panel. FIG. 19 is a diagram for describing traveling of light that has entered an imaging device including a diffuser panel. FIG. 20 is a diagram for describing traveling of light that has passed through a diffuser panel. It is to be noted that in FIGS. 18 to 20, configurations indicated by broken lines indicate traveling of light in a case where a reflection optical system is replaced with a transmission optical system. Further, in FIGS. 18 to 20, for example, a pixel pitch $2r$ of the image sensor 10 is set to 0.00001 m, and the distance D from the light reception surface of the image sensor 10 to the coded aperture 302 is set to 0.01 m. Moreover, in FIGS. 19 and 20, the distance d from the light reception surface of the image sensor 10 to the diffuser panel 110 is set to 0.0001 m (meter), and the scattering angle $\beta$ based on the normalized circularly symmetric scattering angle profile of the diffuser panel 110 is set to approximately 0.047 (radians) on the basis of the following Expression (11). It is to be noted that in Expression (11), the scattering angle $\beta$ of approximately 0.047 (radians) is calculated on the basis of Expression (4), for example, so that the light L10 outputted from the diffuser panel 110 falls within one light receiving element 132.

[Math. 11]

$$\beta = \arctan\left(\frac{r\cos(\alpha)}{d}\right) \quad (11)$$

First, in the case where there is no diffuser panel, as illustrated in FIG. 18, the light L1 that has entered via the optical aperture of the coded aperture 302 enters a point P on the light reception surface of the image sensor 10. Further, light L92 that has been reflected at the point P is reflected on the light-shielding portion of the coded aperture 302, and light L93 obtained by this reflection enters a point Q on the light reception surface of the image sensor 10. Thus, spots of light formed on the light reception surface of the image sensor 10 are two points P and Q.

Thus, as described above, in the case where it is assumed that the reflectance Rs on the light reception surface of the image sensor 10 is 0.3 and the reflectance Ms on the light-shielding portion of the coded aperture 302 is 0.9, a light intensity of the spot formed at the point Q by the two reflections is 0.27 times (=0.3×0.9) a light intensity of the spot formed at the point P.

In contrast, in the case where the diffuser panel 110 is provided, as illustrated in FIG. 19, the light L1 that has entered via the optical aperture of the coded aperture 302 enters the diffuser panel 110 at a point A in the forward direction and diffuses, thereby being uniformly converted into the light L10 which is scattered light having a spread angle 2β. Thereafter, the light L10 forms a spot approximately centered on the point P on the light reception surface of the image sensor 10. A scattering angle profile ρ(α) of the light at the spot including the point P may be expressed by the following Expression (12). It is to be noted that in Expression (12), a light intensity at an angle deviating from the scattering angle β is set to 0.

[Math. 12]

$$\rho(\alpha) = \begin{cases} \frac{1}{\pi\beta^2} \approx 143.3, & \text{where } |\alpha| \leq \beta \\ 0, & \text{where } |\alpha| > \beta \end{cases} \quad (12)$$

Further, as illustrated in FIG. 20, the light L11 diffused at the point A and reflected on the light reception surface of the image sensor 10 thereafter enters in the opposite direction the diffuser panel 110 at a point B and is diffused to be converted into the light L12, and is further reflected on the light-shielding portion of the coded aperture 302. The light L23 reflected on the light-shielding portion enters in the forward direction the diffuser panel 110 at a point C and is diffused to be converted into light L24. The light L24 forms a spot having a remarkably large diameter approximately centered on the point Q on the light reception surface of the image sensor 10.

As described above, in the case where the diffuser panel 110 is provided, the secondary reflected light (corresponding to L24) that re-enters the image sensor 10 is diffused by the diffuser panel 110 two or more times (three times in this example). Accordingly, it becomes possible to expand the diameter of the spot formed on the light reception surface of the image sensor 10 by the secondary reflected light and to blur the image, which makes it possible to further reduce the artifact caused by the secondary reflection.

For example, a radius (see FIG. 19) of the spot formed by the light L24 (secondary reflected light) that has been reflected on the light reception surface of the image sensor 10 and has re-entered the light reception surface of the image sensor 10 is approximately (2D+d)/d times the radius r (see FIG. 20) of the spot formed by the light L10 that has passed through the diffuser panel 110 once and has entered the light reception surface of the image sensor 10. Therefore, a light intensity at the spot formed by the light L24 (secondary reflected light) is approximately 0.000007 on the basis of the following Expression (13).

[Math. 13]

$$Ms \times Rs \frac{\pi r^2}{\pi\left(\frac{2D+d}{d}\right)^2 r^2} = \frac{d^2}{(2D+d)^2} Ms \times Rs \approx 0.000007 \quad (13)$$

As described above, according to the present embodiment, the provision of the diffuser panel 110 makes it possible to greatly reduce the light intensity (=0.000007) of the spot formed by the secondary reflected light (corresponding to L24 in FIG. 20) compared to the light intensity (=0.27) of the spot formed by the secondary reflected light (corresponding to L93 in FIG. 18) in the case where the diffuser panel is not provided.

3.3 Workings and Effects

As described above, even in the case where the coded aperture 302 is used instead of the lens 102, similarly to the first embodiment, it is possible to sufficiently blur the image of the light L23 that has been reflected on the image sensor 10 and on the surrounding reflective member (e.g., coded aperture 302) and has re-entered the image sensor 10 to a negligible extent, by disposing the diffuser panel 110 close to the light reception surface of the image sensor 10. This makes it possible to reduce the artifact caused by the secondary reflection.

Other configurations, operations, and effects may be similar to those of the above-described embodiments, and therefore detailed description thereof is omitted.

Although the embodiments of the present disclosure have been described above, the technical scope of the present disclosure is not limited to the above-described embodiments as it is, and various modifications can be made within a scope that does not depart from the gist of the present disclosure. In addition, components of different embodiments and different modification examples may be combined as appropriate.

In addition, the effects in each of the embodiments described herein are merely illustrative and not limited, and other effects may be obtained.

It is to be noted that the present technology may have the following configurations.

(1)

An imaging device including:

a diffuser that converts incident light into scattered light whose diameter is expanded in accordance with a propagation distance and outputs the scattered light; and a light receiver that converts light diffused by the diffuser into an electric signal.

(2)
The imaging device according to (1), in which the diffuser converts the incident light into the scattered light to cause a size of a spot formed on an entrance surface of light of the light receiver by at least half of the scattered light to be smaller than a size of the entrance surface of the light receiver.

(3)
The imaging device according to (1) or (2), in which a scattering angle profile ρ(α) of the diffuser satisfies the following Expression (14),

[Math. 14]

$$2\pi \int_0^\beta p(\alpha)\alpha d\alpha > 0.5, \text{ where } \beta = \arctan\left(\frac{r \times \cos(\max(\theta))}{d}\right) \quad (14)$$

where α represents a deviation angle from an optical axis of the incident light, θ represents an incident angle of the incident light, β represents a scattering angle of the scattered light, r represents a radius of a spot formed on an entrance surface of light of the light receiver by the scattered light, and d represents a distance from the entrance surface to the diffuser.

(4)
The imaging device according to (3), in which a size of the light receiver is 2r or more.

(5)
The imaging device according to any one of (1) to (4), in which the light receiver is an infrared detection element that receives an infrared ray and converts the infrared ray into an electric signal.

(6)
The imaging device according to (5), in which the infrared detection element is any one of a pyroelectric sensor, a thermopile, and a bolometer.

(7)
The imaging device according to any one of (1) to (6), further including
an optical system through which the incident light passes, in which
the diffuser is closer to the light receiver than to the optical system.

(8)
The imaging device according to (7), in which the optical system is a lens that condenses the incident light.

(9)
The imaging device according to (7), in which the optical system is a coded aperture.

(10)
The imaging device according to any one of (1) to (9), further including a microlens that is provided on a one-to-one basis to the light receiver, and condenses light that enters the light receiver.

(11)
The imaging device according to any one of (1) to (10), further including a filter that limits light that enters the light receiver to light having a particular wavelength.

(12)
The imaging device according to (11), in which the diffuser is disposed between the light receiver and the filter.

(13)
The imaging device according to (11), in which the diffuser is disposed on an opposite side to the light receiver with the filter interposed therebetween.

(14)
The imaging device according to any one of (1) to (10), in which the diffuser limits light that enters the light receiver to light having a particular wavelength.

(15)
A solid-state imaging device including:
a semiconductor substrate;
a diffuser provided on the semiconductor substrate, the diffuser converting incident light into scattered light whose diameter expands in accordance with a propagation distance and outputting the scattered light; and
a light receiver provided on the semiconductor substrate, the light receiver receiving light diffused by the diffuser and causing an electric charge to be generated.

REFERENCE SIGNS LIST 1 controller
3 element array
5, 15 signal processing circuit
10, 10A, 10B, 20 image sensor
11 timing control circuit
12 pixel driving circuit
13 pixel array
17 reference voltage generator
18 horizontal transfer circuit
19 output circuit
21 semiconductor substrate
22 microlens
23 filter
24 light receiver
100, 300 imaging device
101 housing
101a ceiling
102 lens
103 aperture
110, 110A diffuser panel
131 unit pixel
132 light receiving element
210 diffuser
302 coded aperture
LD pixel drive line
HSL horizontal signal line
VSL vertical signal line
L1, L2, L3, L10, L11, L12, L13, L14, L21, L23, L24 light
L20, L22 scattered light

The invention claimed is:

1. An imaging device, comprising:
a housing that includes:
a light receiver; and
a diffuser configured to:
convert incident light into scattered light, wherein a diameter of the scattered light is expanded based on in a propagation distance of the scattered light,
the diffuser is closer to a light reception surface of the light receiver than a surface of an inner wall of the housing, and
the propagation distance corresponds to a distance travelled by the scattered light; and
output the scattered light, wherein the light receiver is configured to convert the scattered light into an electric signal.

2. The imaging device according to claim 1, wherein the diffuser is further configured to convert the incident light into the scattered light to cause a size of a spot formed on a light entrance surface of the light receiver by at least half of the scattered light to be smaller than a size of the light entrance surface of the light receiver.

3. The imaging device according to claim 1, wherein a scattering angle profile p(a) of the diffuser satisfies the following Expression (1),

[Math. 1]

$$2\pi \int_0^\beta p(\alpha)\alpha d\alpha > 0.5, \text{ where } \beta = \arctan\left(\frac{r \times \cos(\max(\theta))}{d}\right) \quad (1)$$

where a represents a deviation angle from an optical axis of the incident light, θ represents an incident angle of the incident light, β represents a scattering angle of the scattered light, r represents a radius of a spot formed on a light entrance surface of the light receiver by the scattered light, and d represents a distance from the light entrance surface to the diffuser.

4. The imaging device according to claim 3, wherein a size of the light receiver is 2r or more.

5. The imaging device according to claim 1, wherein the light receiver is an infrared detection element configured to:
receive an infrared ray; and convert the infrared ray into the electric signal.

6. The imaging device according to claim 5, wherein the infrared detection element is at least one of a pyroelectric sensor, a thermopile, or a bolometer.

7. The imaging device according to claim 1, further comprising an optical system through which the incident light passes, wherein the diffuser is closer to the light receiver than to the optical system.

8. The imaging device according to claim 7, wherein the optical system is a lens configured to condense the incident light.

9. The imaging device according to claim 7, wherein the optical system is a coded aperture.

10. The imaging device according to claim 1, further comprising a microlens on a one-to-one basis to the light receiver, wherein the microlens is configured to condense light that enters the light receiver.

11. The imaging device according to claim 1, further comprising a filter configured to limit light that enters the light receiver to light having a particular wavelength.

12. The imaging device according to claim 11, wherein the diffuser is between the light receiver and the filter.

13. The imaging device according to claim 11, wherein the diffuser is on an opposite side to the light receiver with the filter interposed therebetween.

14. The imaging device according to claim 1, wherein the diffuser is further configured to limit light that enters the light receiver to light having a particular wavelength.

15. A solid-state imaging device, comprising:
a housing that includes:
a semiconductor substrate;
a light receiver on the semiconductor substrate; and
a diffuser on the semiconductor substrate, wherein the diffuser is configured to:
convert incident light into scattered light, wherein
a diameter of the scattered light expands based on a propagation distance of the scattered light,
the diffuser is closer to a light reception surface of the light receiver than a surface an inner wall of the housing, and
the propagation distance corresponds to a distance travelled by the scattered light; and
output outputting the scattered light, wherein the light receiver is configured to convert the scattered light into an electric signal.

* * * * *